(12) United States Patent
Adam et al.

(10) Patent No.: US 8,642,415 B2
(45) Date of Patent: Feb. 4, 2014

(54) SEMICONDUCTOR SUBSTRATE WITH TRANSISTORS HAVING DIFFERENT THRESHOLD VOLTAGES

(75) Inventors: Thomas N. Adam, Slingerlands, NY (US); Kangguo Cheng, Schenectady, NY (US); Bruce B. Doris, Brewster, NY (US); Balasubramanian S. Haran, Watervliet, NY (US); Pranita Kulkarni, Mount Kisco, NY (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/487,511

(22) Filed: Jun. 4, 2012

(65) Prior Publication Data

US 2013/0295730 A1  Nov. 7, 2013

Related U.S. Application Data

(63) Continuation of application No. 13/463,402, filed on May 3, 2012.

(51) Int. Cl.
*H01L 21/8238* (2006.01)
(52) U.S. Cl.
USPC .......................... 438/199; 438/163; 438/300
(58) Field of Classification Search
CPC .............................................. H01L 21/823814
USPC .................................................. 438/199, 300
See application file for complete search history.

(56) References Cited

U.S. PATENT DOCUMENTS

| 4,876,213 | A | 10/1989 | Pfiester |
| 5,030,582 | A | 7/1991 | Miyajima et al. |
| 5,296,401 | A | 3/1994 | Mitsui et al. |
| 6,063,676 | A | 5/2000 | Choi et al. |
| 6,064,096 | A | 5/2000 | Son |
| 6,204,540 | B1 | 3/2001 | Otsuki |
| 6,238,982 | B1 | 5/2001 | Krivokapic et al. |
| 6,316,302 | B1 | 11/2001 | Cheek et al. |
| 6,346,447 | B1 * | 2/2002 | Rodder ......................... 438/300 |
| 6,714,039 | B2 | 3/2004 | Salcido et al. |

(Continued)

FOREIGN PATENT DOCUMENTS

EP       0948041 A2 * 10/1999 ............ H01L 21/266

OTHER PUBLICATIONS

K. Cheng et al., "Extremely Thin SOI (ETSOI) Technology: Past, Present, and Future," 2010 IEEE International SOI Conference, Oct. 11-14, 2010, 4 pages.*

(Continued)

*Primary Examiner* — Kevin Parendo
*Assistant Examiner* — Pauline Vu
(74) *Attorney, Agent, or Firm* — Cantor Colburn LLP; Vazken Alexanian

(57) ABSTRACT

A method of creating a semiconductor integrated circuit is disclosed. The method includes forming a first field effect transistor (FET) device and a second FET device on a semiconductor substrate. The method includes epitaxially growing raised source/drain (RSD) structures for the first FET device at a first height. The method includes epitaxially growing raised source/drain (RSD) structures for the second FET device at a second height. The second height is greater than the first height such that a threshold voltage of the second FET device is greater than a threshold voltage of the first FET device.

9 Claims, 12 Drawing Sheets

(56) References Cited

U.S. PATENT DOCUMENTS

| | | | |
|---|---|---|---|
| 6,828,630 | B2 | 12/2004 | Park et al. |
| 6,845,042 | B2 * | 1/2005 | Ichige et al. ............. 365/185.17 |
| 6,846,734 | B2 | 1/2005 | Amos et al. |
| 7,192,894 | B2 | 3/2007 | Bu et al. |
| 7,230,435 | B2 | 6/2007 | Kunikiyo et al. |
| 7,754,594 | B1 | 7/2010 | Chudzik et al. |
| 2002/0008261 | A1 | 1/2002 | Nishiyama |
| 2005/0095820 | A1 * | 5/2005 | van Bentum et al. ......... 438/478 |
| 2006/0065937 | A1 * | 3/2006 | Hoffmann et al. ............ 257/401 |
| 2006/0131656 | A1 * | 6/2006 | Shin et al. .................... 257/369 |
| 2006/0252191 | A1 * | 11/2006 | Kammler et al. ............. 438/197 |
| 2007/0228482 | A1 * | 10/2007 | Wei et al. ...................... 257/369 |
| 2008/0217686 | A1 * | 9/2008 | Majumdar et al. ............ 257/347 |
| 2009/0039426 | A1 * | 2/2009 | Cartier et al. ................ 257/344 |
| 2010/0090288 | A1 | 4/2010 | Holt et al. |
| 2010/0240178 | A1 | 9/2010 | Shin |
| 2011/0227159 | A1 | 9/2011 | Chan et al. |
| 2012/0025282 | A1 * | 2/2012 | Doris et al. .................. 257/296 |

OTHER PUBLICATIONS

K. Cheng et al., "ETSOI CMOS for System-on-Chip Applications Featuring 22nm Gate Length, Sub-100nrn Gate Pitch, and 0.08μm2 SRAM Cell," 2011 Symposium on VLSI Circuits (VLSIC), Jun. 15-17, 2011, pp. 128-129.

K. Cheng et al., "Extremely Thin SOI(ETSOI) Technology: Past, Present, and Future," 2010 IEEE International SOI Conference (SOI), Oct. 11-14, 2010, 4 pages.

A. Majumdar et al., "Gate Length and Performance Scaling of Undoped-Body Extremely Thin Soi MOSFETs," IEEE Electron Device Letters, vol. 30, Apr. 2009, pp. 413 -415.

K. Cheng_P. Kulkarni et al., "Extremely thin SOI (ETOSI) CMOS with record low variability for low power system-on chip applications", 2009 IEEE International, Electron Devices Meeting (IEDM), Dec. 7-9, 2009, 4 pages.

K. Cheng and P. Kulkarni et al., "Extremely thin SOI (ETSOI) CMOS with record low variability for low power system-on-chip applications", 2009 IEEE International, Electron Devices Meeting (IEDM), Dec. 7-9, 2009, 4 pages.

U.S. Appl. No. 13/463,402; Non-Final Office Action; Date Filed: May 3, 2012; Date of Mailing: Oct. 4, 2013; pp. 1-26.

* cited by examiner

SEMICONDUCTOR SUBSTRATE WITH TRANSISTORS HAVING DIFFERENT THRESHOLD VOLTAGES

CROSS-REFERENCE TO RELATED APPLICATION

This application is a continuation of U.S. patent application Ser. No. 13/463,402, filed May 3, 2012, the disclosure of which is incorporated by reference herein in its entirety.

BACKGROUND

The present invention generally relates to semiconductor devices, and more specifically, to a semiconductor substrate having transistors with different threshold voltage values.

A system-on-chip (SOC) application may require various sets of transistors to achieve a balance between power and performance. Devices having varying threshold voltages $V_t$ may be needed in an SOC application to meet different performance and power requirements. The threshold voltage $V_t$ is a function of a number of parameters including channel length, gate material, gate insulation material and thickness, and the channel doping concentration.

In silicon-on-insulator (SOI) fabrication technology, transistors are built on a relatively thin silicon layer (or any other semiconducting material). The silicon layer rests on an insulating layer, usually constructed of silicon dioxide ($SiO_2$), and may be referred to as a buried oxide or BOX. Extremely thin SOI (ETSOI) devices generally have a silicon layer (also referred to as an ETSOI layer) with a thickness that is usually about 20 nanometers (nm) or less. Due to the limited thickness of the ETSOI layer, channel doping is generally less effective in ETSOI devices. However, the threshold voltage $V_t$ is dependent on the level of channel doping concentration. In one alternative approach to doping, an ETSOI application with transistors having varying threshold voltages $V_t$ may be created by using different gate stack structures. However, creating different gate stack structures on a single substrate may have severe process integration limitations especially when the difference in different threshold voltage $V_t$ devices are around 100 mV.

SUMMARY

According to one embodiment, a method of creating a semiconductor integrated circuit is provided. The method includes forming a first field effect transistor (FET) device and a second FET device on a semiconductor substrate. The method includes epitaxially growing raised source/drain (RSD) structures for the first FET device at a first height. The method includes epitaxially growing raised source/drain (RSD) structures for the second FET device at a second height. The second height is greater than the first height such that a threshold voltage of the second FET device is greater than a threshold voltage of the first FET device.

BRIEF DESCRIPTION OF THE SEVERAL VIEWS OF THE DRAWINGS

FIGS. 6-11 are cross sectional views illustrating the exemplary for creating the semiconductor substrate as described in FIG. 5, in which:

FIG. 6 illustrates a starting ETSOI substrate;

FIG. 7 illustrates the formation of a gate stack on the ETSOI substrate of FIG. 6;

FIG. 8 illustrates patterning of the gate stack of FIG. 7;

FIG. 9 illustrates the formation of sidewall spacers on the patterned gate stack of FIG. 8;

FIG. 10 illustrates the formation of epitaxially grown raised source/drain (RSD) regions of different heights for different transistors;

FIG. 11 illustrates ion implantation of the structures of FIG. 10; and

DETAILED DESCRIPTION

The lack of effective channel doping in ETSOI devices results in a need for producing transistors having different threshold voltages $V_t$ by other non-doping techniques. One such technique is described in exemplary embodiments of the present disclosure, and involves creating a single substrate having various transistors with a raised source drain configuration (RSD). The transistors as disclosed may be implemented in gate-first or gate-last approaches, and does not require changing the thickness of the ETSOI layer, the channel length, or the gate-dielectric layers and their thicknesses. The single substrate includes various transistors having different threshold voltages. The transistors as disclosed in the exemplary embodiments of the present disclosure do not require doped channels, thus avoiding a short channel penalty and dopant fluctuation variability. The single substrate as disclosed overcomes the current challenge of creating different gate stack structures on a single substrate to create different threshold voltages $V_t$.

Figure 1:
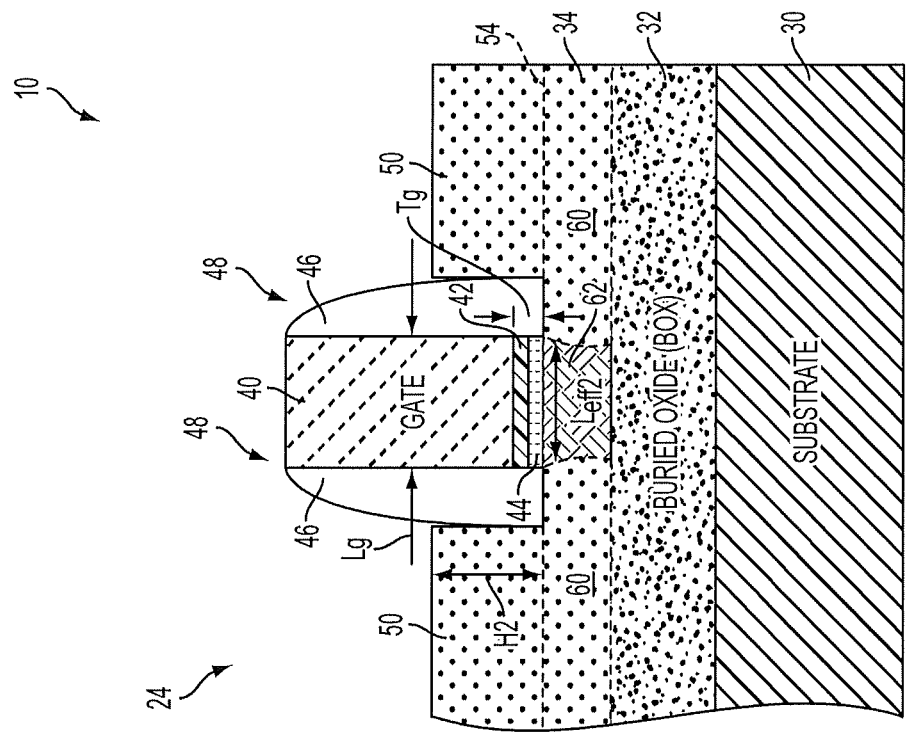
FIG. 1 is a cross-sectional view of a semiconductor substrate having a plurality of transistor devices.
Figure 1:
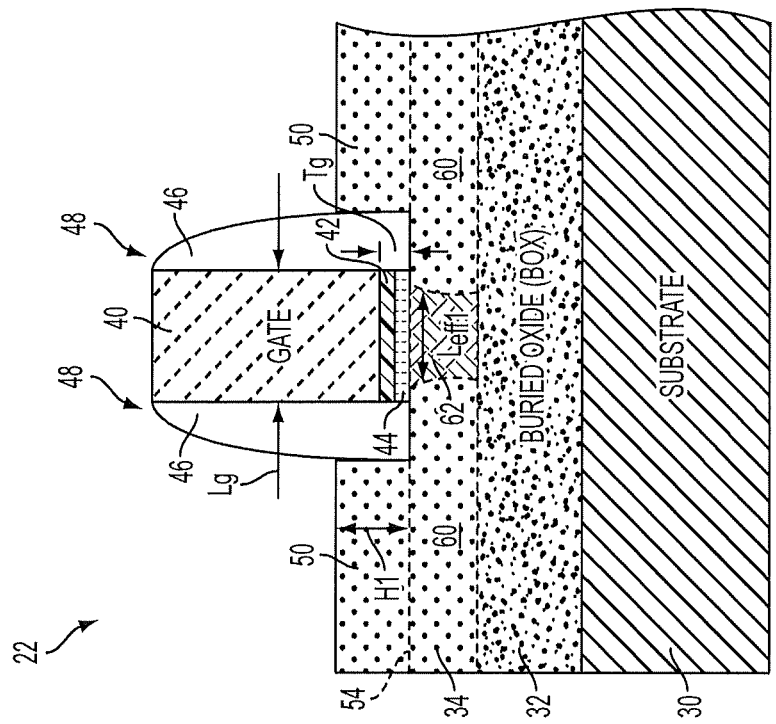

Referring now to FIG. 1, a cross-sectional view of an exemplary semiconductor structure 10 is shown. The semiconductor structure 10 (also referred to as an SOI wafer) may be used in an integrated circuit such as, for example, a system-on-a-chip (SOC) integrated circuit. The semiconductor structure 10 includes various transistors, two of which are illustrated as transistor 22 and transistor 24. The transistors 22 and 24 may be any type of field effect transistor (FET) such as, for example, an NFET or PFET device, that is produced using extremely thin silicon-on-insulator (ETSOI) fabrication technology. The transistors 22 and 24 may be, for example, fully depleted devices, planar type transistors such as transistors produced by a partially depleted SOI fabrication technology, or bulk-silicon devices. In the exemplary embodiment as shown, the semiconductor structure 10 includes a substrate 30, a buried oxide (BOX) layer 32, and an ETSOI layer 34 (also illustrated in FIG. 5). The BOX layer 32 may be constructed from an oxide, nitride, oxynitride or any combination thereof and an oxide such as silicon dioxide ($SiO_2$).

In one embodiment, the ETSOI layer 34 has a thickness ranging from about 1 nm to about 20 nm. In an alternative embodiment, the ETSOI layer 34 may include a thickness ranging from about 3 nm to about 10 nm. In one approach, the semiconductor structure or SOI wafer 10 is formed by thinning a relatively thick SOI wafer (a wafer having a thickness of about 30 nm to about 90 nm) using oxidation and a hydrofluoric (HF) wet etch. The ETSOI layer 34 can be any semiconducting material, including, but not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The transistors 22 and 24 each include a gate 40, at least one gate dielectric layer (two of which are illustrated in FIGS. 1 as 42 and 44), and spacers 46 located on opposing lateral sides 48 of the gate 40. The gate 40 may be constructed from polysilicon or another conducting material such as metal (e.g., metal alloys, metal silicides, metal carbides, etc.). The dielectric layers 42 and 44 are placed along the ETSOI layer 34, and the gate 40 rests on the dielectric layers 42 and 44. The gate dielectric layers 42 and 44 may be constructed from a material such as, for example, silicon oxide, silicon oxynitride (SiON), a high-k dielectric material (e.g., a hafnium- or aluminum-based material), or a combination thereof. The gate 40 may be created using conventional gate-first approaches, or alternatively, a replacement metal gate flow approach. In one embodiment, the spacers 46 may be constructed from an oxide.

The transistors 22 and 24 each include a raised source/drain (RSD) structures 50. The RSD structures 50 are epitaxially grown. The epitaxially grown RSD structures 50 may be constructed from various types of semiconductor material such as, for example, silicon-germanium (SiGe) or silicon carbide (SiC). Epitaxial growth occurs on a top surface 54 of the ETSOI layer 34. When the chemical reactants are controlled and the system parameters set correctly, the depositing atoms arrive at the top surface 54 of the ETSOI layer 34 with sufficient energy to move around on the surface and orient themselves to the crystal arrangement of the atoms of the deposition surface. For example, an epitaxial film deposited on a [100] crystal surface (cut along the [100] plane) will take on a [100] orientation. If, on the other hand, the wafer has an amorphous surface layer, the depositing atoms have no surface to align to and form polysilicon instead of single crystal silicon. Silicon sources for the epitaxial growth include silicon tetrachloride, dichlorosilane ($SiH_2Cl_2$), and silane ($SiH_4$). The temperature for this epitaxial silicon deposition is from about 550° C. to about 900° C. In one embodiment, doped RSD structures 50 may be formed through epitaxial growth of SiGe on the top surface 54 of the ETSOI layer 34. The Ge content of the epitaxial grown SiGe ranges from about 5% to about 60% (by atomic weight). In another embodiment, the Ge content of the epitaxial grown SiGe ranges from about 10% to about 40%.

Figure 2:
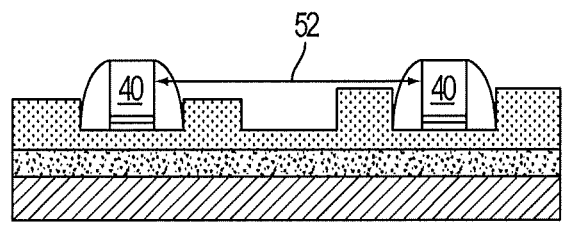
FIG. 2 is another view of the semiconductor substrate in FIG. 1.

The RSD devices 50 have an epitaxy height, where the transistor 22 includes an epitaxy height H1 and the transistor 24 includes an epitaxy height H2, measured from the top surface 54 of the ETSOI layer 34. As seen in FIG. 1, the epitaxy height H1 is less than the epitaxy height H2. Thus, the epitaxy height of the various RSD structures 50 located on the semiconductor substrate 10 may vary, however the PC pitch (e.g., the pitch between two substantially parallel gates 40, which is indicated by reference number 52 in FIG. 2) remains the same between multiple transistors on the conductor semiconductor substrate 10. The gate lengths $L_g$, and the gate insulator thicknesses $T_g$ of the dielectric layers 42 and 44 remain the same between the transistors 22 and 24.

For example, in one illustrative embodiment, the semiconductor substrate 10 could include various transistors, where a portion of the transistors have an epitaxy height of about 12 nm, another portion of the transistors have an epitaxy height of about 20 nm, and a remaining portion of the transistors have an epitaxy height about 30 nm. In another embodiment, a portion of the transistors have an epitaxy height of about 12 nm, another portion of the transistors have an epitaxy height of about 15 nm, and a remaining portion of the transistors have an epitaxy height of about 18 nm. In one embodiment, the epitaxy height of the transistors may generally range from about 3 nm to about 35 nm, where the transistor 22 ranges from about 3 nm to about 30 nm, and the transistor 24 ranges from about 6 to about 35 nm.

The RSD structures 50 may be created by one or more deposition processes such as, for example, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination thereof.

The epitaxy heights of the RSD structures 50 may be varied by masking various regions of the semiconductor substrate depending on the intended epitaxy height of the RSD structures 50. Specifically, for example, the transistor 22 may be masked first, and the RSD structure 50 of the transistor 24 is allowed to epitaxially grow to the epitaxy height H2. Then, the masking is removed from the transistor 22, and the transistor 24 is masked. The RSD structures 50 corresponding to the transistor 22 are then epitaxially grown to the epitaxy height H1. In one embodiment, the RSD structures 50 may be in-situ doped (i.e., doped when grown).

After epitaxially growing the RSD structures 50, the semiconductor substrate 10 undergoes ion implantation. Ions are implanted into the RSD structure 50 and the ETSOI layer 34, creating extension structures 60 of the RSD structures 50 within the ETSOI layer 34. It should be noted that the dopant ions, ion energy, tilt, and angle of implantation are substantially the same for both transistors 22 and 24 during ion implantation. The gate 40 and the spacers 46 act as a mask during ion implantation such that portions of the ETSOI layer 34 may not experience significant ion implantation. These portions of the ETSOI layer 34 that do not experience significant ion implantation create a channel 62 within the ETSOI layer 34 between the extension structures 60. The semiconductor substrate 10 may then undergo junction annealing to activate the dopant within the extension structures 60. Some examples of annealing processes include, for example, rapid thermal annealing, furnace annealing, flash lamp annealing, or a combination thereof.

An effective length of each channel 62 depends on the epitaxy height of the RSD structures 50. Specifically, the greater the epitaxy height of the RSD structure 50, the greater the effective length of the channel 62. For example, the transistor 22 includes a channel length $L_{eff1}$, and the transistor 24 includes a channel length $L_{eff2}$. The epitaxy height H2 of the transistor 24 is greater than the epitaxy height H1 of the transistor 22. Thus, the channel length $L_{eff2}$ is greater than the channel length $L_{eff1}$. This is because as the epitaxy height of the RSD structures 50 increase, less ion implantation occurs within the ETSOI layer 34, thereby creating a longer effective channel length. However, although the effective channel length varies, both transistors 22 and 24 generally have about the same gate length.

The effective channel length of the channel 62 will affect a threshold voltage $V_t$ of the transistors 22 and 24. Specifically, a longer effective channel length will result in a relatively higher threshold voltage V, and a shorter effective channel length will result in a relatively lower threshold voltage $V_t$. For example, the transistor 22 with the effective channel length $L_{eff1}$ has a lower threshold voltage $V_t$ than the transistor 24 with the effective channel length $L_{eff2}$. Thus, the semiconductor substrate 10 will include various transistors (e.g., transistors 22 and 24) that have varying threshold voltages V, which may be required various SOC applications to meet different performance and power requirements.

Figure 3:
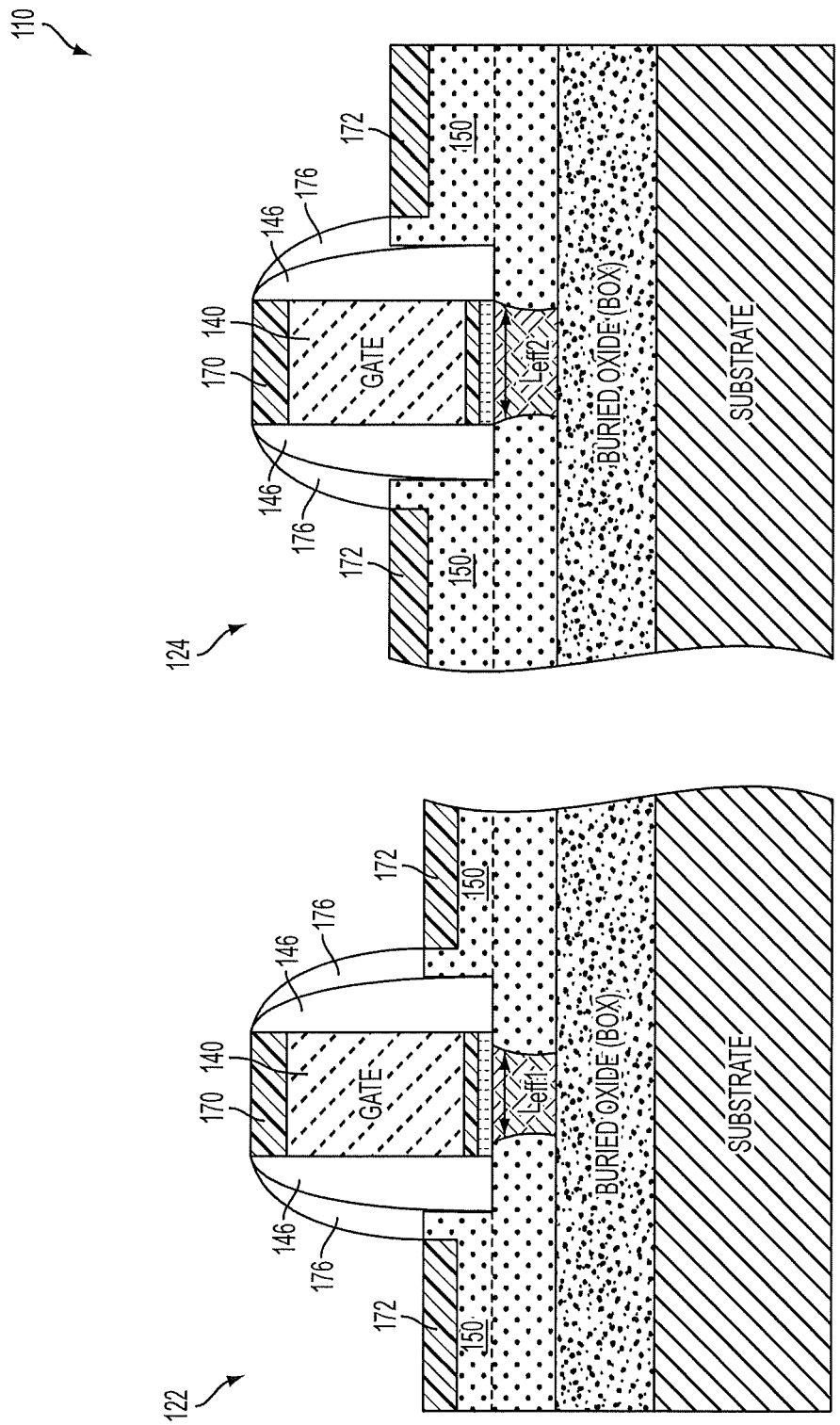
FIG. 3 is an alternative embodiment of the semiconductor substrate shown in FIG. 1.

FIG. 3 is an alternative embodiment of a semiconductor substrate 110 having transistors 122 and 124. The transistors 122 and 124 each include a gate silicide contact 170 for gates 140, and silicide contacts 172 for RSD structures 150. The gate silicide contact 170 and the silicide contacts 172 may be created by depositing a metal layer over the gates 140 and the RSD structures 150, followed by an annealing process such as, for example, rapid thermal annealing. During annealing, the metal reacts with silicon to form a metal silicide. The metal layer may be, for example, nickel, cobalt, titanium, platinum, or a combination thereof. In the exemplary embodiment as shown in FIG. 3, the transistors 122 and 124 may also include secondary spacers 176 that are placed over spacers 146. The secondary spacers 176 may be created by reactive ion etching (RIE).

Figure 4:
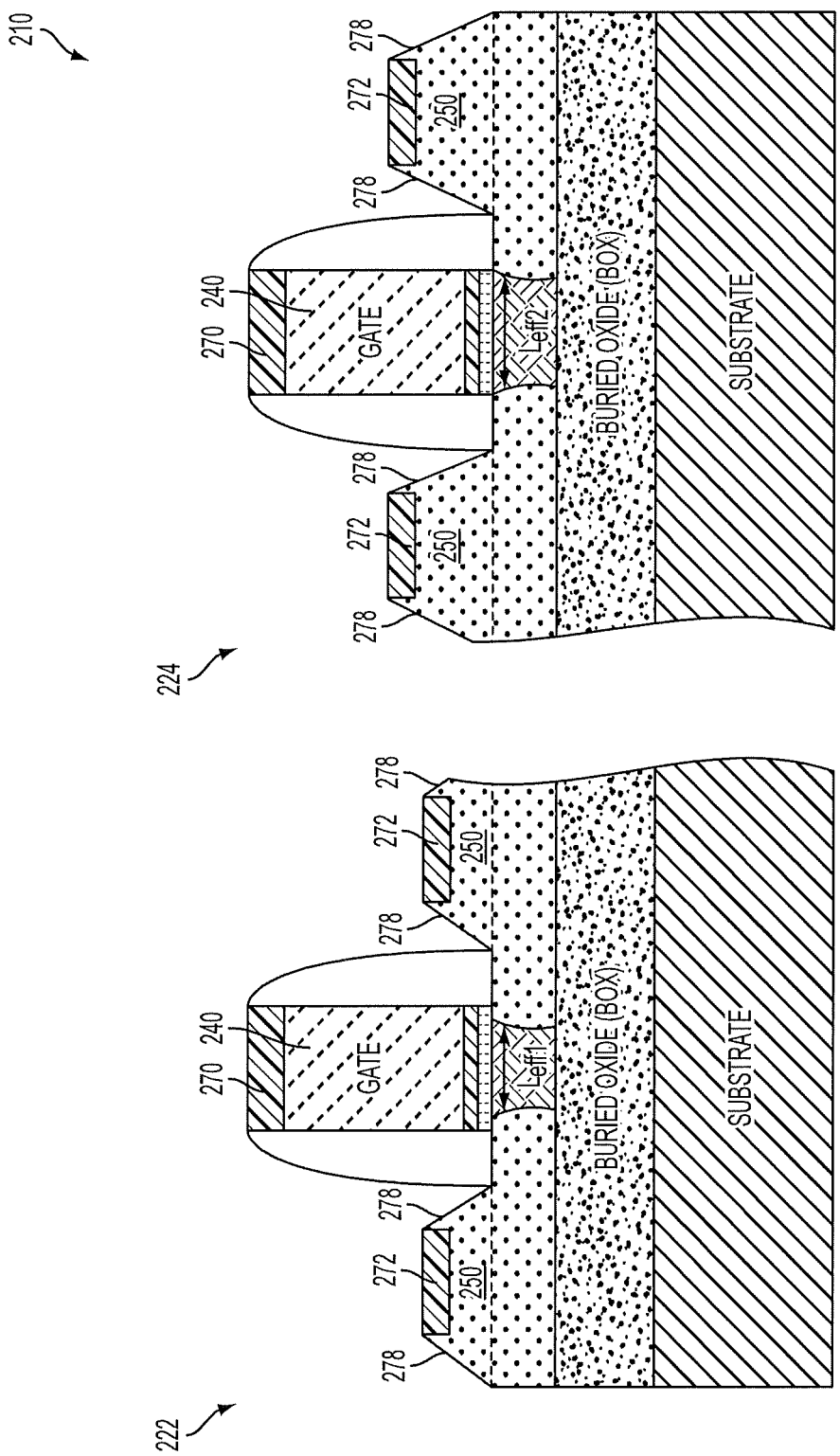
FIG. 4 is an another embodiment of the semiconductor substrate shown in FIG. 1.

FIG. 4 is another embodiment of a semiconductor substrate 210 having transistors 222 and 224. The transistors 222 and 224 each include a gate silicide contact 270 for gates 240, and silicide contacts 272 for RSD structures 250. In the embodiment as shown, the transistors 222 and 224 also include RSD structures 250 having a faceted cross-section. That is, the RSD structures 250 have lateral sides 278 that are sloped or angled.

Figure 5:
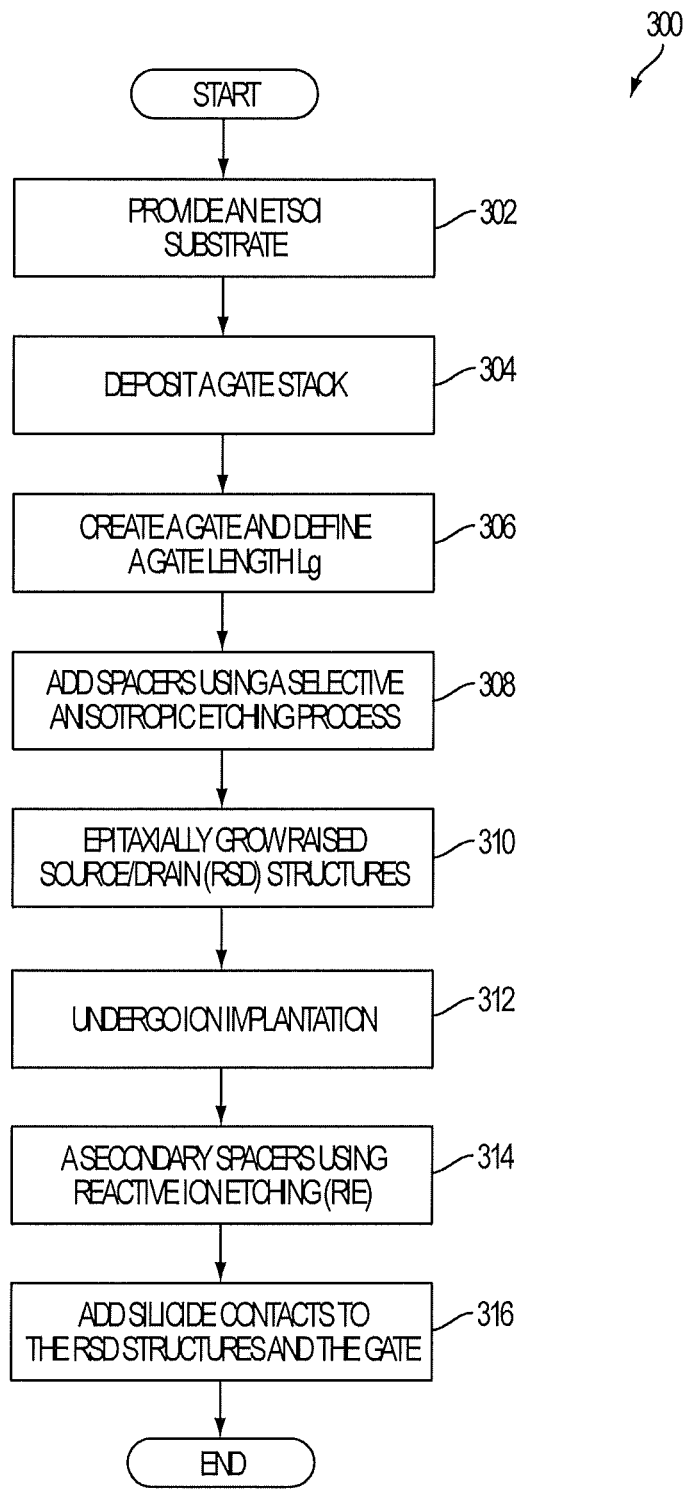
FIG. 5 is a process flow diagram illustrating a process for creating the semiconductor substrate as shown in FIGS. 1-4.
Figure 6:
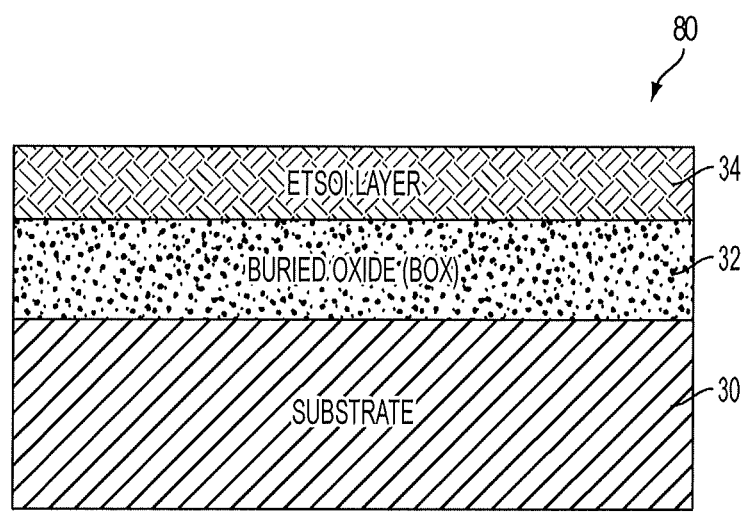

A method of creating the semiconductor substrate 10, 110 or 210 will now be described. Turning now to FIG. 5, a process flow diagram 300 is illustrated. Referring now to FIGS. 5-6, the method may begin at block 302 by providing an ETSOI substrate 80 (shown in FIG. 6). The ETSOI substrate 80 includes the substrate 30, the BOX layer 32, and the ETSOI layer 34. Method 300 may then proceed to block 304.

Figure 7:
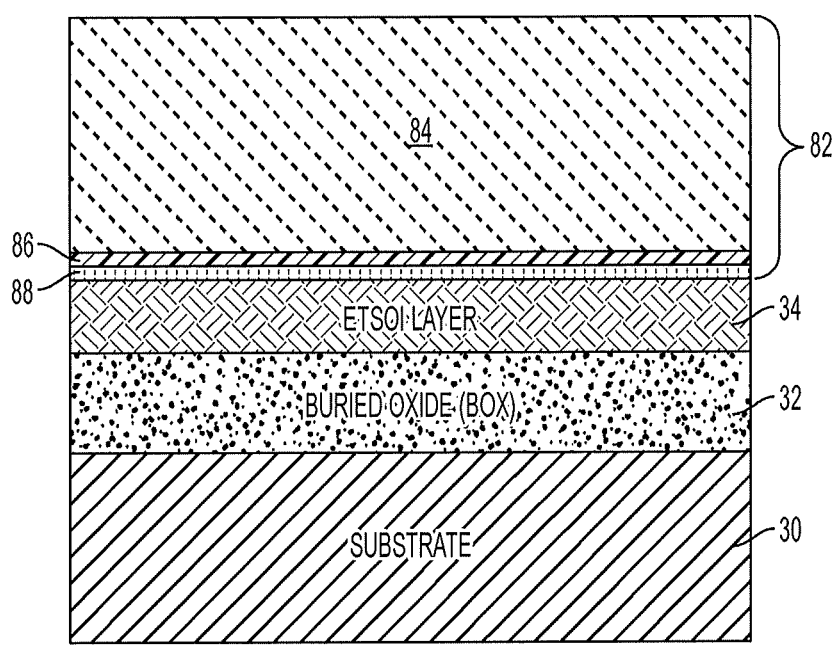

Referring now to FIGS. 5 and 7, in block 304 a gate stack 82 is deposited over the ETSOI layer 34. The gate stack 82 may include a gate material 84, and various gate dielectric layers 86 and 88. Method 300 may then proceed to block 306.

Figure 8:
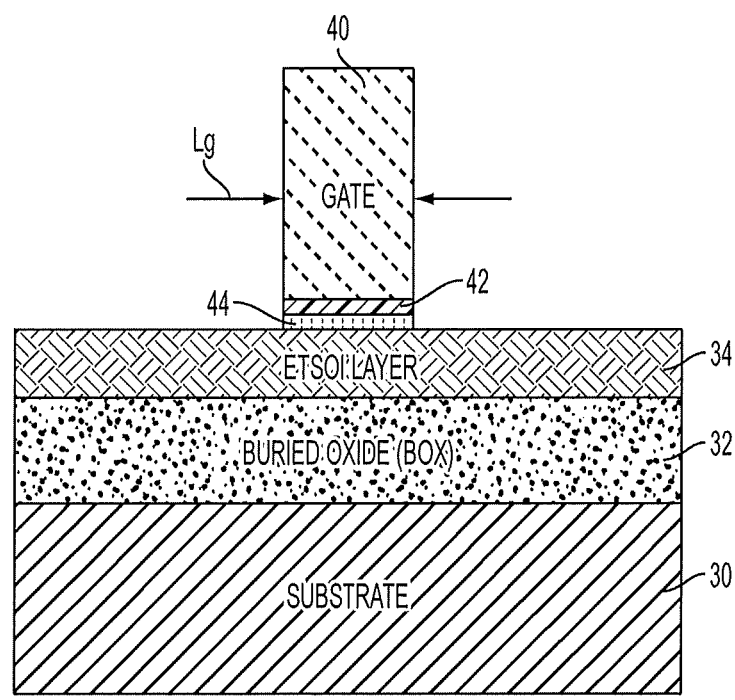

Referring now to FIGS. 5 and 8, in block 306, the gate 40 and the dielectric layers 42 and 44 are created by a conventional gate patterning process. This also defines the gate length Lg. Although a conventional gate patterning process is discussed, it is to be understood that alternative approaches may be used as well to create the gate 40. For example, in another approach, a replacement metal gate flow process utilizing a sacrificial polysilicon gate may be used instead. Method 300 may then proceed to block 308.

Figure 9:
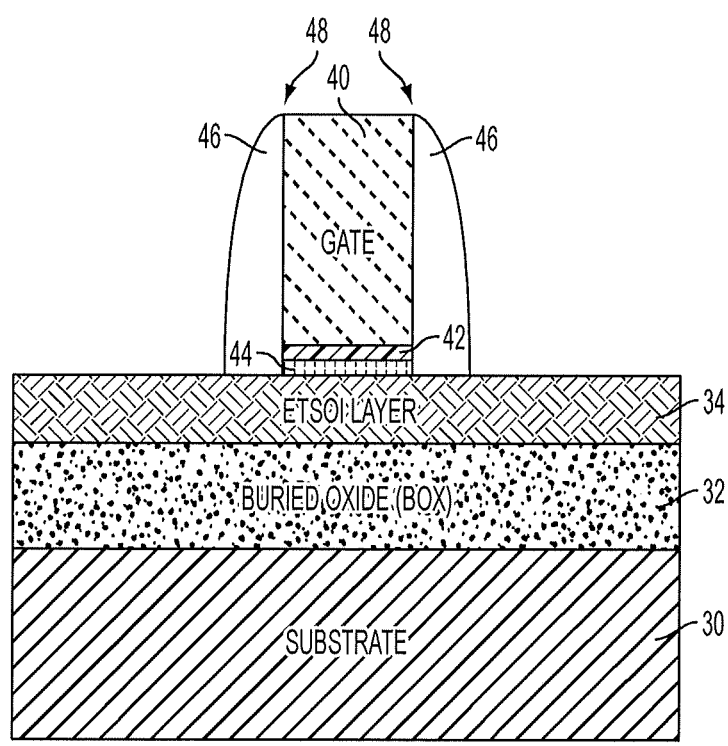

Referring now to FIGS. 5 and 9, in block 308 the spacers 46 are added to the lateral sides 48 of the gate 40. The spacers 46 may be constructed from an oxide, and are created using a selective anisotropic etching process. Method 300 may then proceed to block 310.

Figure 10:
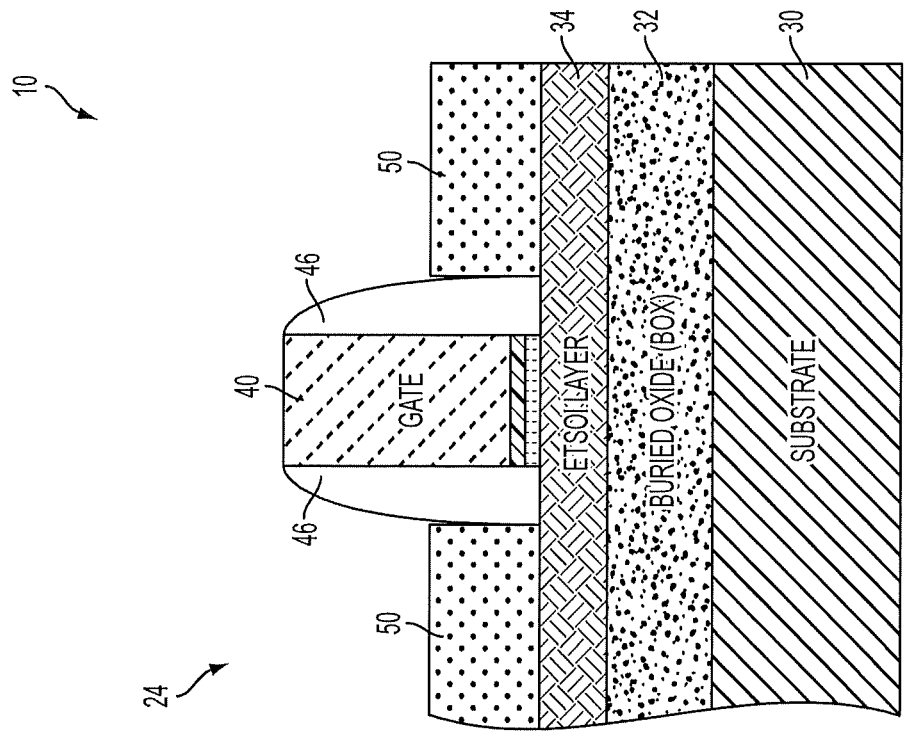
Figure 10:
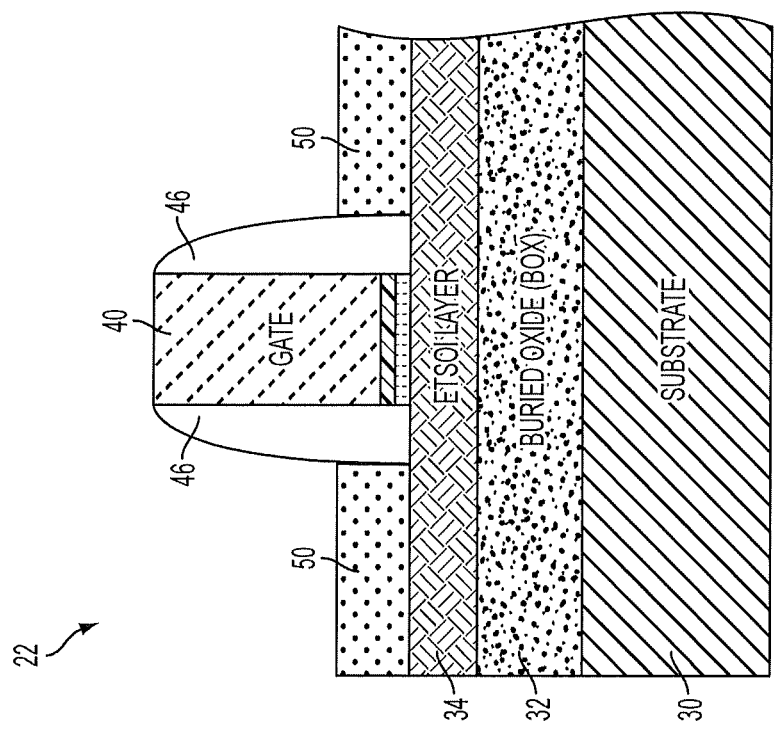

Referring now to FIGS. 5 and 10, in block 310 the RSD structures 50 are grown on the ETSOI layer 34 to different epitaxy heights. The RSD structures 50 may be created by a deposition process as described above, where the epitaxy heights of the RSD structures 50 may be varied by masking various regions of the semiconductor substrate depending on the intended epitaxy height of the RSD structures 50. In one embodiment as shown in FIG. 3, the RSD structures 250 are epitaxially grown to create a faceted cross-section. Method 300 may then proceed to block 312.

Figure 11:
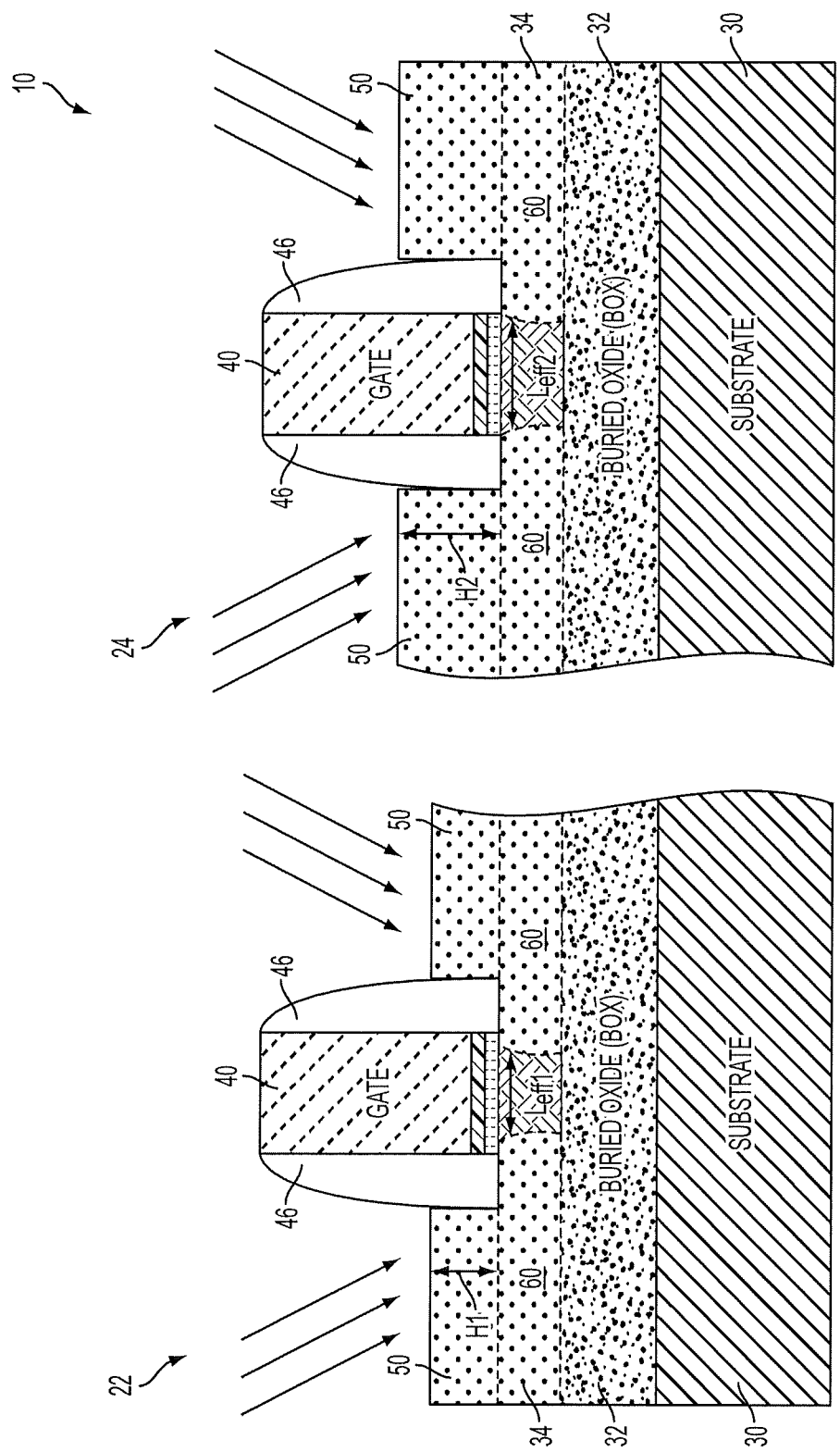

Referring to FIGS. 5 and 11, in block 312 the semiconductor substrate 10 undergoes ion implantation. The semiconductor substrate 10 may then undergo junction annealing to activate dopant within the extension structures 60. Method 300 may then proceed to block 314.

Figure 12:
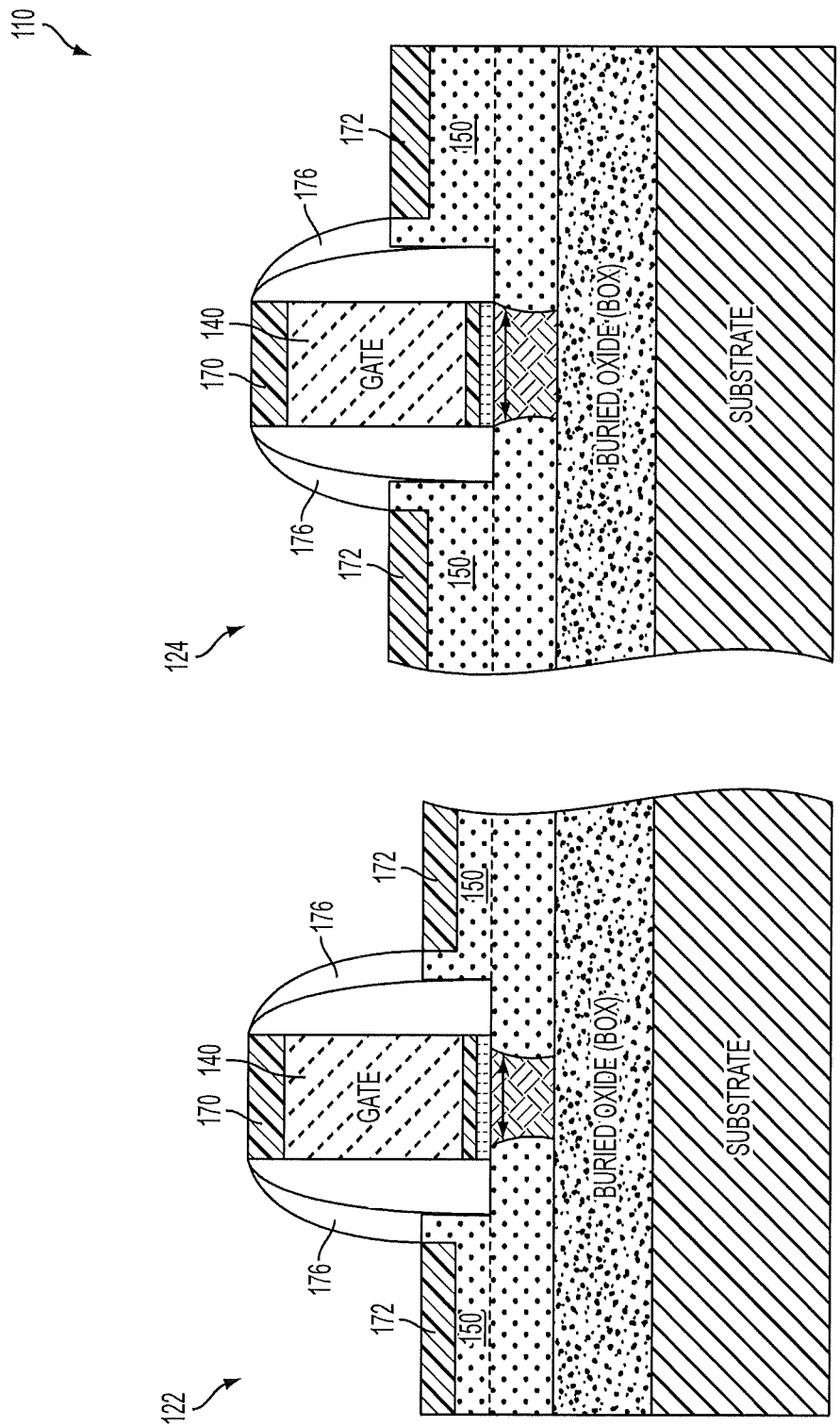
FIG. 12 illustrates formation of secondary side wall spacers on the gate stack and creation of silicide contacts on the gate stack on the RSD structures.

Referring now to FIGS. 3, 5 and 12, in block 314 the secondary spacer 176 may be added to the transistors 122 and 124 by a reactive ion etching (RIE) approach. It should be noted that block 314 is optional, and may be omitted in some embodiments. Method 300 may then proceed to block 316.

With continued reference to FIGS. 3, 5 and 12, in block 316 the transistors 122 and 124 each include silicide contacts 172 for the RSD structures 150. The silicide contacts 172 may be created by depositing a metal layer such as, for example, nickel, cobalt, titanium, platinum, or a combination thereof over the gates 140 and the RSD structures 150, followed by an annealing process such as, for example, rapid thermal annealing. The gate silicide contact 170 may be included. The gate silicide contact 170 is also created by depositing metal over the gate 140, and followed by an annealing process. It should be noted that block 316 is also optional, and may be omitted in some embodiments. Method 300 may then terminate.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of creating a semiconductor integrated circuit, comprising:
    forming a first field effect transistor (FET) device and a second FET device on a semiconductor substrate;
    epitaxially growing raised source/drain (RSD) structures for the first FET device at a first height;
    epitaxially growing raised source/drain (RSD) structures for the second FET device at a second height, wherein the second height is greater than the first height such that a threshold voltage of the second FET device is greater than a threshold voltage of the first FET device;
    forming the gate structures of the first and second FET devices on at least one gate dielectric layer of an extremely thin silicon-on-insulator (ETSOI) substrate that is part of the semiconductor substrate, wherein a gate length of the second FET device is the same as a gate length of the first FET device; and
    implanting ions within the ETSOI layer, wherein the gate structures act as a mask as ions are implanted such that an effective channel length of the second FET device is longer than an effective channel length of the first FET device, and such that extension structures of the first FET device extend further beneath the gate structure thereof in a lateral direction with respect to extension structures of the second FET device.

2. The method of claim 1, further comprising masking the RSD structures for the first FET device for a duration of time while growing the RSD structures for the second FET device so as to achieve the second height being greater than the first height.

3. The method of claim 1, wherein dopant ions, ion energy, tilt and angle of implantation are substantially the same for both the first and second FET devices as ions are implanted.

4. The method of claim 1, further comprising creating a first set of spacers disposed on lateral sides the gate structures by a selective anisotropic etching process.

5. The method of claim 4, further comprising creating a second set of spacers disposed on lateral sides of the gate structures over the first set of spacers, the second set of spacers created by reactive ion etching (RIE).

6. The method of claim 1, further comprising creating a gate silicide contact for the gate structures by depositing a metal over the gate structures, and annealing the metal.

7. The method of claim 1, further comprising epitaxially growing the RSD structures of the first and second FET devices by one or more deposition processes.

8. The method of claim 1, further comprising epitaxially growing the RSD structures of the first and second FET devices to create a faceted cross-section.

9. The method of claim 1, further comprising creating a silicide contact for each the RSD structures of the first and second FET devices by depositing a metal over the RSD structures of the first and second FET devices, and annealing the metal.

* * * * *